United States Patent [19]
Ogawa

[11] Patent Number: 5,677,111
[45] Date of Patent: Oct. 14, 1997

[54] PROCESS FOR PRODUCTION OF MICROPATTERN UTILIZING ANTIREFLECTION FILM

[75] Inventor: Tohru Ogawa, Kanagawa, Japan

[73] Assignee: Sony Corporation, Tokyo, Japan

[21] Appl. No.: 547,288

[22] Filed: Oct. 24, 1995

Related U.S. Application Data

[63] Continuation-in-part of Ser. No. 320,119, Oct. 11, 1994, Pat. No. 5,472,829, and a continuation of Ser. No. 998,743, Dec. 30, 1992, abandoned.

[30] Foreign Application Priority Data

| Dec. 20, 1991 | [JP] | Japan | 3-360521 |
| Dec. 30, 1991 | [JP] | Japan | 3-360523 |
| Mar. 11, 1992 | [JP] | Japan | 4-087911 |
| Mar. 11, 1992 | [JP] | Japan | 4-087912 |
| Aug. 20, 1992 | [JP] | Japan | 4-244314 |
| Oct. 31, 1992 | [JP] | Japan | 4-316073 |

[51] Int. Cl.$^6$ .................. G03C 1/825; G03F 7/30
[52] U.S. Cl. .................. 430/313; 430/323; 430/325; 430/376; 430/510; 430/512; 430/523; 430/950
[58] Field of Search .................. 430/313, 323, 430/325, 326, 510, 512, 523, 950

[56] References Cited

U.S. PATENT DOCUMENTS

| 4,407,927 | 10/1983 | Kamoshida et al. | 430/197 |
| 5,077,185 | 12/1991 | Cho et al. | 430/523 |
| 5,472,827 | 12/1995 | Ogawa et al. | 430/325 |
| 5,472,829 | 12/1995 | Ogawa | 430/325 |

FOREIGN PATENT DOCUMENTS

| 1-241125 | 9/1989 | Japan . |
| 2-148731 | 6/1990 | Japan . |

*Primary Examiner*—Christopher G. Young
*Attorney, Agent, or Firm*—Hill, Steadman & Simpson

[57] ABSTRACT

A process for production of a micropattern, comprised of a step for forming an antireflection film comprised of an inorganic film on an underlying substrate, a step for forming a resist film on said antireflection film, a step for exposing said resist film using i-rays or light of a wavelength shorter than i-ray and transferring a mask pattern to the resist film, a step for using the resist film on which the mask pattern had been transferred as a mask to etch the antireflection film and transfer the mask pattern to the antireflection film; and a step for using the antireflection film on which said mask pattern had been transferred as a mask to etch the underlying substrate and transfer the mask pattern to the underlying substrate.

9 Claims, 19 Drawing Sheets

INTERFERENCE OF LIGHT IN RESIST FILM

STANDING WAVE EFFECT $\lambda$ = 248nm
XP8843/Si
nPR = 1.802, kPR = 0.0107
nSi = 1.5717, kSi = 3.583

STANDING WAVE EFFECT $\lambda$ = 248 nm
XP 8843/Al-Si
nPR = 1.802, kPR = 0.0107
nsub = 0.089, ksub = 2.354

EFFECT OF STEP DIFFERENCE $d_{PR1} \approxeq d_{PR2}$  S : SUBSTRATE
In : FOR EXAMPLE, POLY-Si
PR : RESIST CHANGES IN AMOUNT OF LIGHT ABSORBED IN RESIST FILM
CASE OF FIXING THICKNESS OF ANTIREFLECTION FILM ARL
AND CHANGING $n_{arl}$ AND $k_{arl}$ FOR CERTAIN RESIST THICKNESS RESIST THICKNESS 985nm ANTIREFLECTION
FILM THICKNESS      20nm

CHANGES FOR DIFFERENT RESIST THICKNESS

RESIST THICKNESS 1000nm

ANTIREFLECTION
FILM THICKNESS      20nm

CHANGES FOR DIFFERENT RESIST THICKNESS

RESIST THICKNESS 1035nm
ANTIREFLECTION
FILM THICKNESS      20nm

Spectroscopic optical constants of SiOxNy:H film.

Simulated ARL performance of SiOxNy:H film for W-Si substrate.

Simulated ARL performance of SiOxNy:H film for Al-Si substrate.

(Calculation condition)
Photoresist: n=1.80, k=0.011
SiOxNy:H: n=2.09, k=0.87, d=24nm
Al-Si: n=0.089, k=2.354

ANTIREFLECTION EFFECT OF $Si_xO_yN_z$ FILM AND $Si_xN_y$ FILM (32 nm) ON Si SUBSTRATE

XP8843/SixOyNz, SixNz (32nm)/Si
 nSixOyNz = 2.0
 kSixOyNz = 0.55

$\lambda = 248$ nm
XP8845 / SiOxNy:H / Aℓ-Si
$n_{PR} = 1.801$, $k_{PR} = 0.011$
$n_{ARL} = 2.04$, $k_{ARL} = 0.225$, $d_{ARL} = 205$nm (SiN4/N2O=0.75)
$n_{sub} = 0.089$, $k_{sub} = 2.354$

PROCESS FOR PRODUCTION OF MICROPATTERN UTILIZING ANTIREFLECTION FILM

This application is a continuation-in-part of Ser. No. 08/320,119 filed Oct. 11, 1994, which issued as U.S. Pat. No. 5,472,829 on Dec. 5, 1995 and was a continuation of Ser. No. 07/998,743 filed Dec. 30, 1992, now abandoned.

BACKGROUND OF THE INVENTION

1. Field of the Invention

The present invention relates to a process for the production of a micropattern used in for example a process for the production of a semiconductor device.

2. Description of the Related Art

At the present time, in the R&D on semiconductor integrated circuits, research is going on in design rule devices of the sub-half micron size. In the photolithographic techniques used in the development of such devices, use is made of exposure devices, called "steppers" (reduced projection and exposure devices), using light of a single wavelength as a source of exposure light.

When exposing by a single wavelength, it is widely known that the phenomenon of a "standing wave effect (thin film interference effect)" occurs. The cause of a standing wave is the multiple interference of exposure light in a resist film. That is, as shown in FIG. 1, the projected light P and the reflected light R from the interface of the resist PR and the substrate S interfere with each other in the resist film. As a result, as shown in FIG. 2, the amount of light absorbed in the resist (vertical axis) changes in accordance with the thickness of the resist (horizontal axis). Note that in the present specification, the "amount of light absorbed in the resist" means the amount of light absorbed in the resist itself, that is, the light minus the surface reflection at the resist surface, the absorption at the substrate, and the light emitted from the resist. The amount of light absorbed becomes the energy behind the optical reaction of the resist.

Note that FIG. 2 shows the results of examination of the changes in the amount of light absorbed due to the thickness of the resist film when forming a resist film (XP8843) on a silicon substrate. As the exposure light, KrF of γ=248 nm is assumed.

The extent of the change in the amount of light absorbed differs depending on the type of the underlying substrate as will be understood from a comparison of FIG. 3 and FIG. 4. In FIGS. 2, 3, and 4, the resist used was XP8843 (made by Shipley Co.) in all cases, but the underlying layer was made Si, Al-Si, and W-Si, respectively. That is, the extent of the change in the amount of light absorbed is determined by the complex amplitude reflection (R) with consideration to the multiple interference determined by the optical constants (n, k) of the underlying layer (substrate) and the optical constants (n, k) of the resist film ((R) indicating a vector quantity with a real portion and an imaginary portion).

Further, in an actual device, as shown in FIG. 5, there are always uneven portions on the substrate surface. For example, there are the projecting portions In made of polycrystalline silicon etc. Accordingly, when coating the resist film PR, the thickness of the resist film will differ at the top and the bottom of the step differences. That is, the thickness $d_{PR2}$ of the resist film on the projecting portions In will be less than the thickness $d_{PR1}$ of the resist film at other portions.

The fact that the standing wave effect differs depending on the thickness of the resist film was as explained earlier. Therefore, the change in the amount of light absorbed by the resist due to the effects of the standing wave effect differs as well. As a result, the dimensions of the resist pattern obtained after exposure and development end up differing at the top and bottom of the step differences. The influence of the standing wave effect on the pattern dimensions becomes more marked the finer the pattern when using a single wavelength, single numerical aperture stepper. This is a phenomenon seen in common for all types of resists.

The precision of the dimensions of a resist pattern in a photolithographic process in the production of a semiconductor device is generally ±5 percent. To achieve this ±5 percent dimensional precision, it is essential to reduce the standing wave effect.

FIG. 6 shows the fluctuations in the dimensions of a resist pattern (vertical axis) with respect to fluctuations in the amount of light absorbed in a resist film (horizontal axis). As clear from FIG. 6, when fabricating a 0.35 μm rule device, the fluctuations in the amount of light absorbed in the resist film should be not more than a 6 percent range.

Earnest efforts are under way in all quarters to develop techniques for preventing reflection so as to solve the above problem. As a result, the present inventors has discovered that SiC, $SiO_x$, $Si_xO_yN_2$, and $Si_xN_y$ are superior antireflection materials for high melting point metal silicides (for example, W-Si), metals (for example, Al-Si), and silicon materials (for example, polycrystalline silicon), considered to require antireflection films.

In the fabrication of an actual device, the semiconductor mask pattern is transferred to a resist and that pattern-transferred resist is used as a mask to etch the SiC, $SiO_x$, $Si_xO_yN_2$, $Si_xN_y$, and other antireflection films and high melting point metal silicides (for example, W-Si), metals (for example, Al-Si), and silicon materials (for example, polycrystalline silicon) and thereby fabricate the semiconductor substrate. At this time, the controllability over dimensions will deteriorate unless a selective ratio is ensured between the resist and layer being processed at the time of etching.

Accordingly, in etching a metal layer, where the selective ratio is a particular problem, the thickness of the resist is made greater. Alternatively, the so-called "inorganic mask method" is used, that is, an oxide film type inorganic film made of plasma TEOS (P-TEOS) is further formed over the antireflection film on the layer to be processed, the pattern-transferred resist is used as a mask to transfer the pattern on the oxide film, then the resist is removed and the pattern-transferred oxide film is used as a mask for etching the metal layer.

When increasing the thickness of the resist, however, there is a problem with a reduction of the resolution performance. Further, with the inorganic mask method using P-TEOS etc., the complexity of the process makes this unsuitable as a mass production technique for semiconductor devices. Therefore, some sort of measure must be urgently taken in the fabrication of a semiconductor mask pattern on an underlying substrate, particularly on an interconnection material, where the selective ratio between the resist and the layer to be processed is not that great at the time of etching.

SUMMARY OF THE INVENTION

The present invention was made in consideration of the above situation and has as its object to provide a process for production of a micropattern and a process for production of a semiconductor device which enable the transfer of an excellent mask pattern by determining an inorganic film having both an antireflection effect and a function as an inorganic mask so as to enable formation of an excellent, stable mask pattern without increasing the number of steps in the process.

To achieve the above object, according to one aspect of the present invention, there is provided a process for production of a micropattern, comprising a step for forming an antireflection film comprised of an inorganic film on an underlying substrate, a step for forming a resist film on the antireflection film, a step for exposing the resist film using i-rays or light of a wavelength shorter than i-rays and transferring a mask pattern to the resist film, a step for using the resist film on which the mask pattern had been transferred as a mask to etch the antireflection film and transfer the mask pattern to the antireflection film; and a step for using the antireflection film on which the mask pattern had been transferred as a mask to etch the underlying substrate and transfer the mask pattern to the underlying substrate.

Preferably, as the antireflection film, use is made of a film containing at least nitrogen and silicon as constituent elements.

More preferably, as the antireflection film, use is made of a film further containing oxygen as a constituent element.

Still more preferably, as the antireflection film, use is made of a film further containing hydrogen as a constituent element.

Preferably, as the antireflection film, use is made of a film with a refractive index (n) of at least 1.7 and not more than 2.4, an imaginary part k of the refractive index (k) of not more than 0.85, and a thickness of from 100 to 500 nm.

Alternatively, as the antireflection film, use is made of a film with a refractive index (n) of at least 1.7 and not more than 2.4, an imaginary part k of the refractive index (k) of at least 0.1 and not more than 0.6, and a thickness of from 100 to 500 nm.

According to another aspect of the present invention, there is provided a process for production of a micropattern, comprising of a step for forming an antireflection film containing at least nitrogen and oxygen as constituent elements on an underlying substrate, a step for forming a resist film on the antireflection film, a step for exposing the resist film using i-rays or light of a wavelength shorter than i-rays and transferring a mask pattern to the resist film, a step for using the resist film on which the mask pattern had been transferred as a mask to etch the antireflection film and transfer the mask pattern to the antireflection film; and a step for using the antireflection film on which the mask pattern had been transferred as a mask to etch the underlying substrate and transfer the mask pattern to the underlying substrate, the antireflection film having a refractive index (n) of at least 1.7 and not more than 2.4, an imaginary part k of the refractive index (k) of not more than 0.85, and a thickness of from 100 to 500 nm.

BRIEF DESCRIPTION OF THE DRAWINGS

These and other objects and features of the present invention will become clearer from the following description of the preferred embodiments given with reference to the drawings, wherein.

DESCRIPTION OF THE PREFERRED EMBODIMENTS

Figure 1:
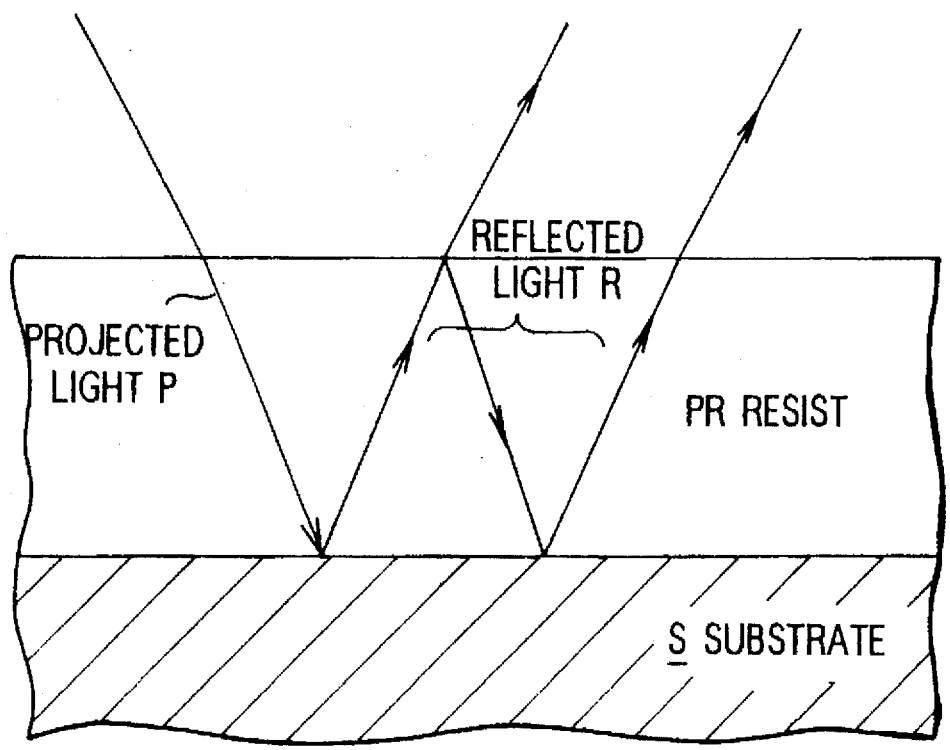
FIG. 1 is a schematic view of the interference of light in a resist film.
Figure 2:
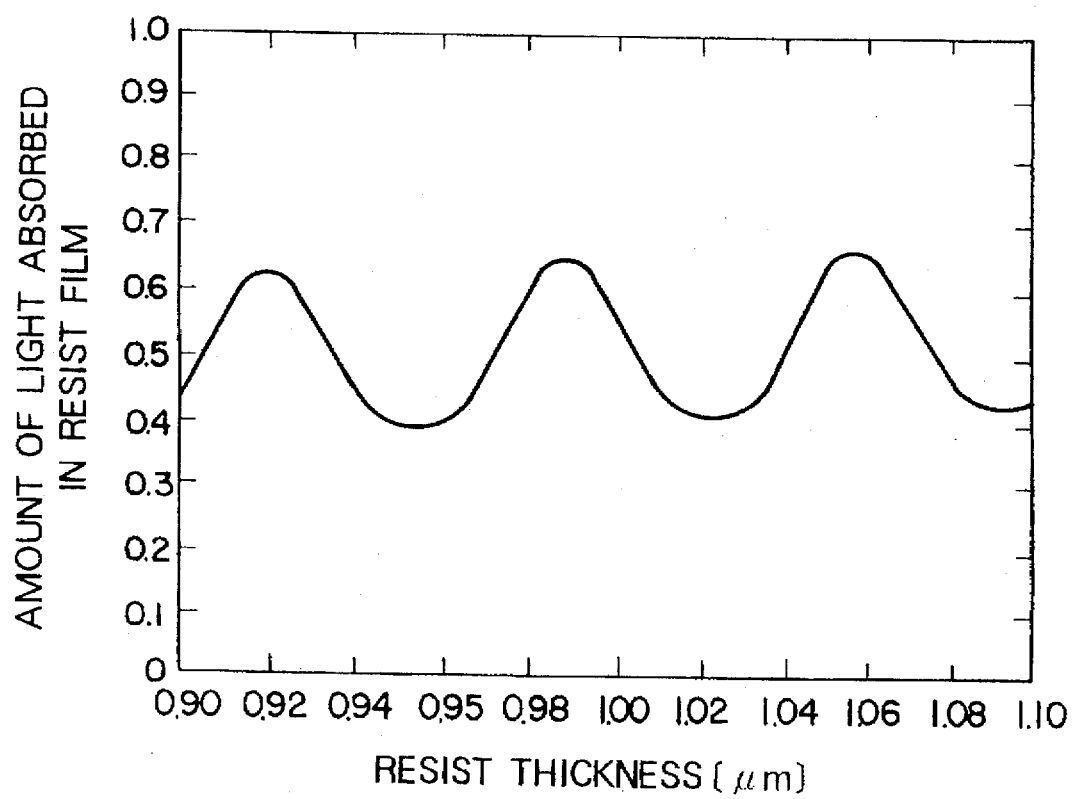
FIG. 2 is a view of the standing wave effect on a silicon substrate.
Figure 3:
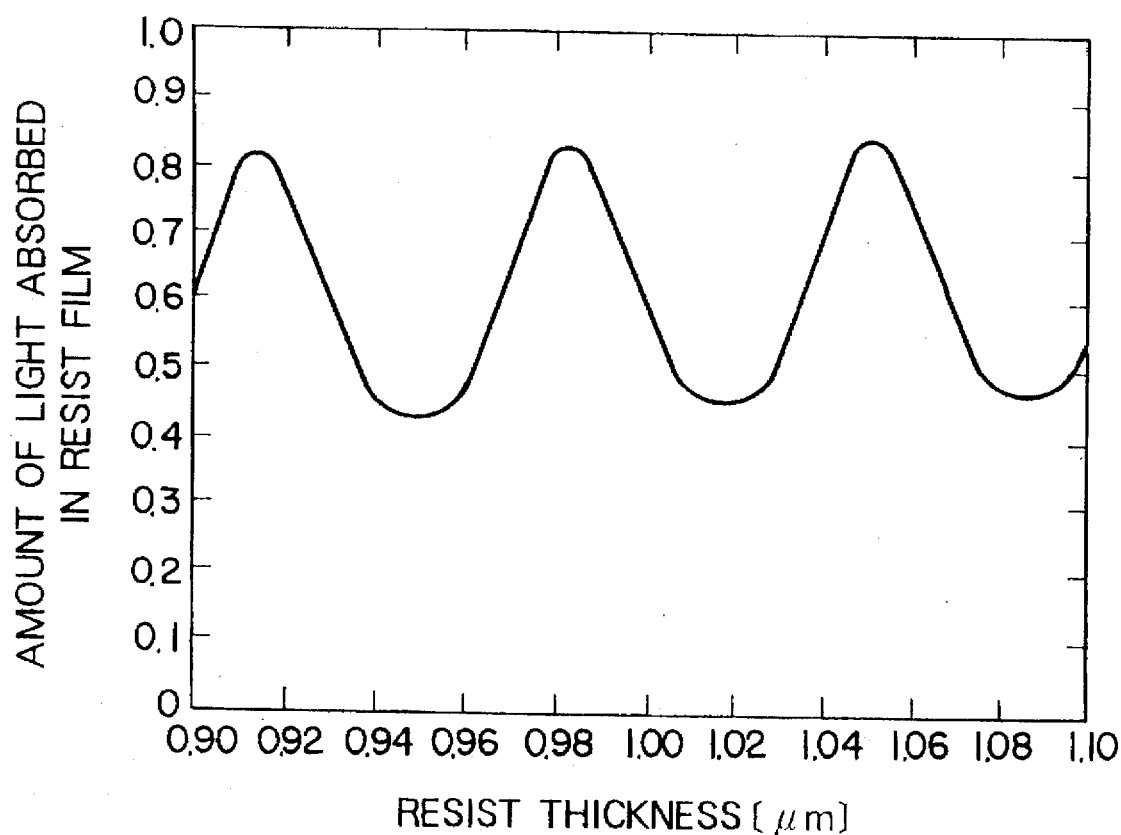
FIG. 3 is a view of the standing wave effect on aluminum silicide.
Figure 4:
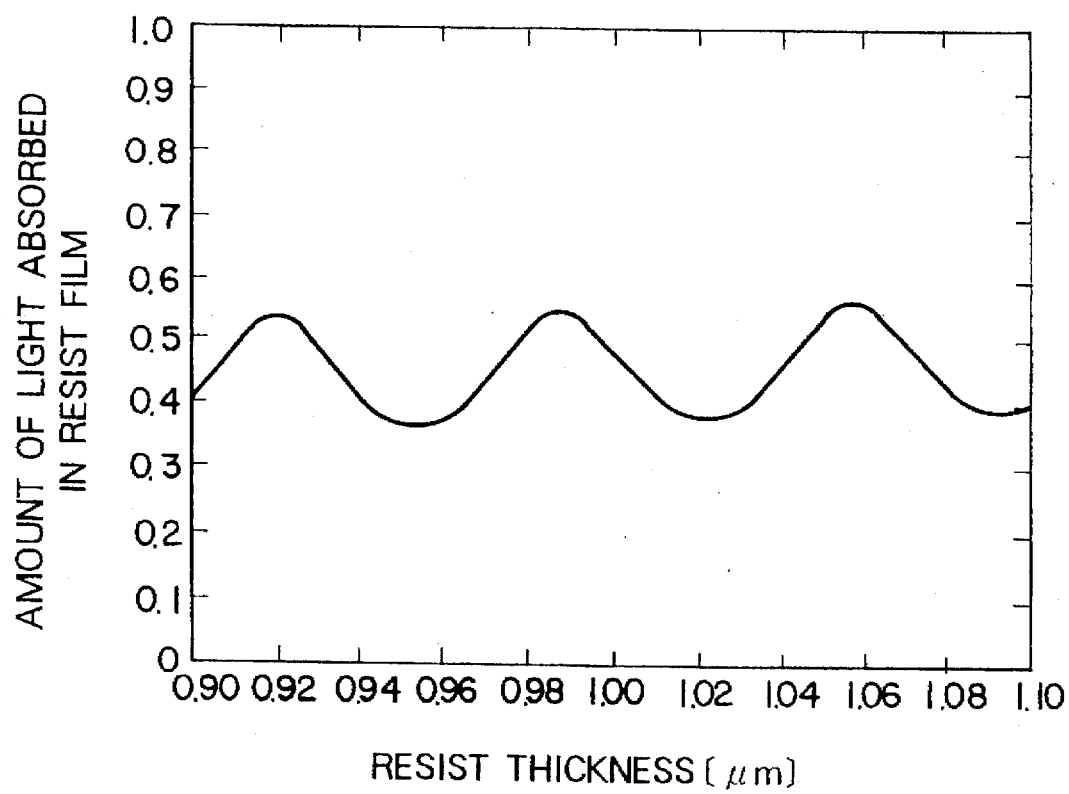
FIG. 4 is a view of the standing wave effect on tungsten silicide.
Figure 5:
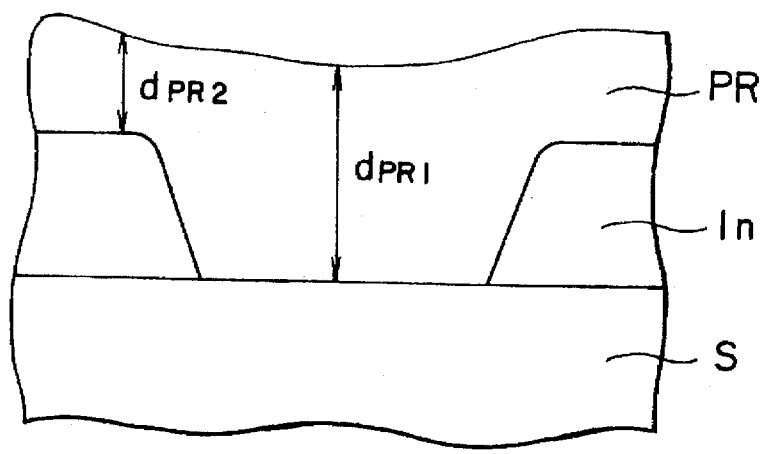
FIG. 5 is a view estimating the effect of a step difference on the standing wave effect.
Figure 6:
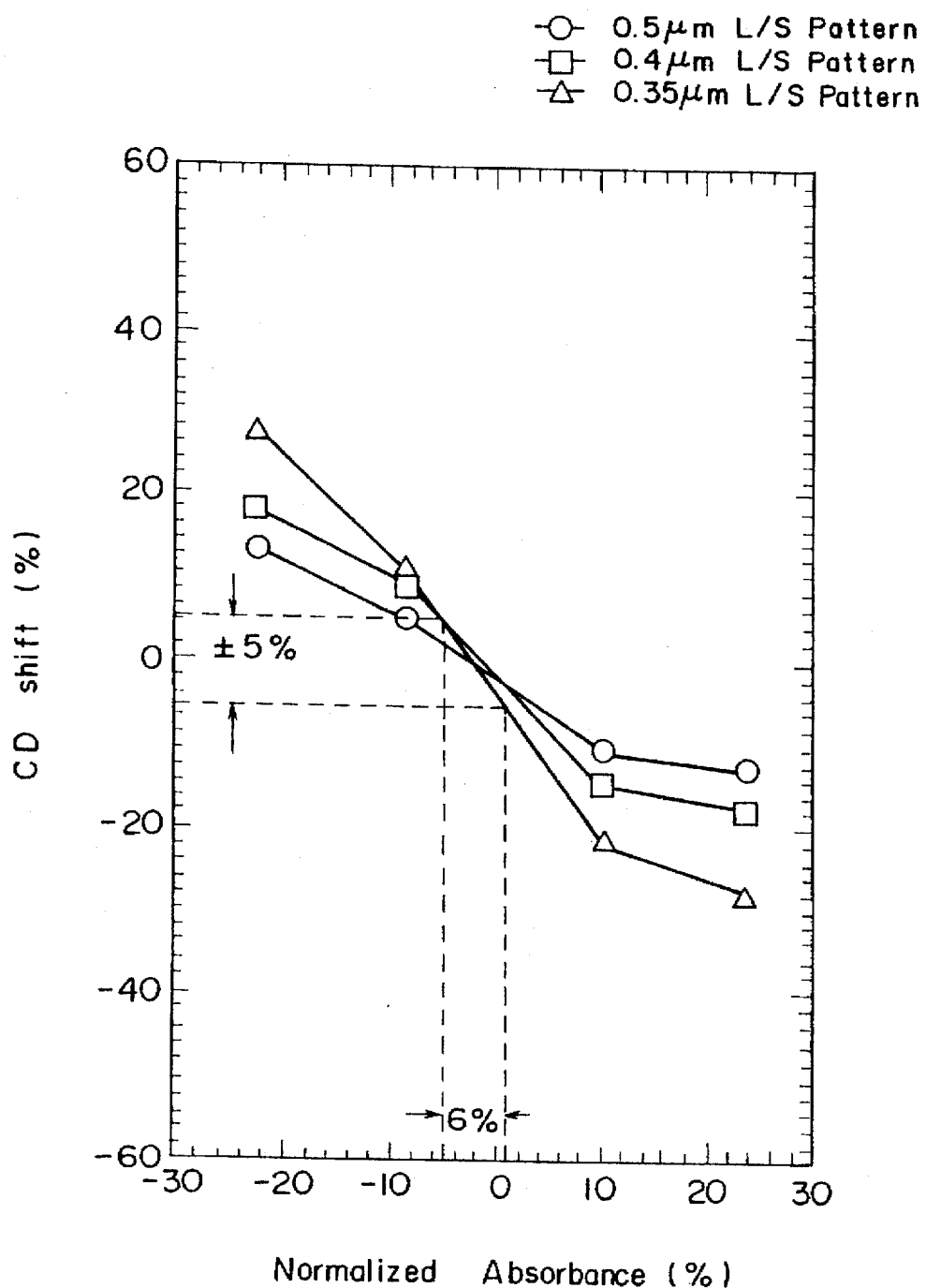
FIG. 6 is a graph of the relationship between fluctuations in the amount of light absorbed and the fluctuations in the pattern dimensions.

Basically, the process for production of a micropattern according to the present invention is comprised of a step of forming on an underlying substrate an antireflection film comprised of an inorganic film, a step of forming a resist film on this antireflection film, a step of using i-rays or light of a wavelength shorter than the i-rays to expose the resist film and transfer a mask pattern on the resist film, a step of using the resist film with the mask pattern transferred on it as a mask to etch the antireflection film and thereby transfer the mask pattern on to the antireflection film, and a step of using the antireflection film with the mask pattern transferred on it as a mask to etch the underlying substrate and transfer the mask pattern on the underlying substrate.

The antireflection film may be comprised of a silicon film (for example, $Si_xO_yN_2$, $Si_2N_y$) including at least nitrogen.

The antireflection film may have a refractive index (n) of from 1.7 to 2.4, an imaginary part (k) of the refractive index of not more than 0.85, and a thickness of 100 to 500 nm.

The surface of the underlying substrate may be comprised of an interconnection layer or an electroconductive layer of gate electrodes etc. When the surface of the underlying substrate is comprised of an interconnection layer or an electroconductive layer of gate electrodes etc., it is preferable to use a chlorine type gas when performing the etching.

The resist film is preferably removed when using the antireflection film as a mask to etch the underlying substrate. The reason is that if the underlying substrate is processed with the resist film left on it, then the carbon C contained in the resist film may have a detrimental impact on the processing of the underlying substrate at the time of etching.

The process for production of a micropattern according to the present invention may be used for a process of production of a semiconductor device.

The present invention enables the formation of an excellent, stable mask pattern without increasing the number of steps, when fabricating a semiconductor device using i-rays (365 nm) or light of a wavelength shorter than that, for example, using i-rays or a KrF or ArF excimer laser, as a light source, by forming an inorganic film providing both an antireflection effect and a function of an inorganic mask, on a metal layer.

When determining the inorganic film providing both the antireflection effect and the inorganic mask function, use is made of the following means:

(I) Contour lines of the amount of light absorbed in the resist film at the time of continuously changing the optical conditions (n, k) of the antireflection film with respect to any predetermined thickness of the resist (where the thickness of the antireflection film is fixed) are found.

(II) From the results of the contour lines of the amount of light absorbed inside the resist at various thicknesses of resist films found in the above (I), the common area where the difference in the amount of light absorbed becomes smallest is found. The optical conditions limited by this common area are used as the optical conditions (n, k) at the thickness of the antireflection film determined in (I).

(III) The thickness of the antireflection film is changed and the procedures of the above (I) and (II) are repeated to find the optical constants (n, k) of the optical conditions for each thickness of the antireflection film.

(IV) The antireflection film of an actual material having the optical constants of the optical conditions obtained in the above (III) is found.

Next, a more detailed explanation will be made, referring to the drawings, of the means (I) to (IV) for determining the comprehensive conditions for the antireflection film used in the present invention.

Figure 7:
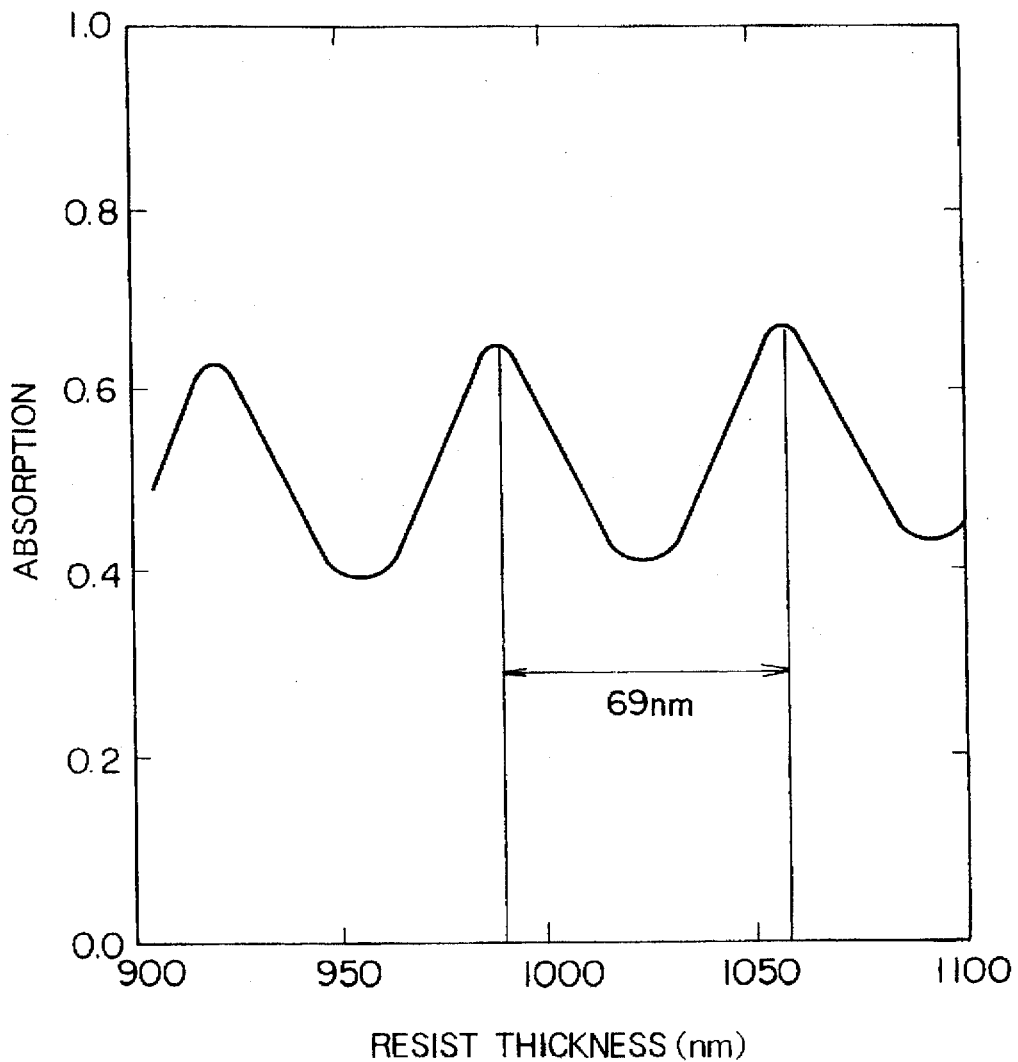
FIG. 7 is a view of the standing wave effect on a silicon substrate.

[1] The thickness of the resist film between the maximal values or minimal values of the standing wave effect is given by $\gamma/4n$ where the refractive index of the resist is made $n_{PR}$ and the wavelength of the exposure light is made $\gamma$ (see FIG. 7).

[2] An antireflection film ARL is assumed to be present between the resist and the underlying substrate with a thickness of $d_{art}$ and optical constants of $n_{art}$ and $k_{art}$.

[3] Focusing on the thickness of one point (for example, the thickness where the standing wave effect becomes maximal) in FIG. 7, when fixing the thickness $d_{art}$ of the antireflection film at $d_{art}$ and changing $n_{art}$ and $k_{art}$, the amount of light absorbed by the resist film at that point changes. When finding the path of that change, that is, the contour lines of the amount of light absorbed, the result becomes as shown in FIG. 8.

Figure 8:
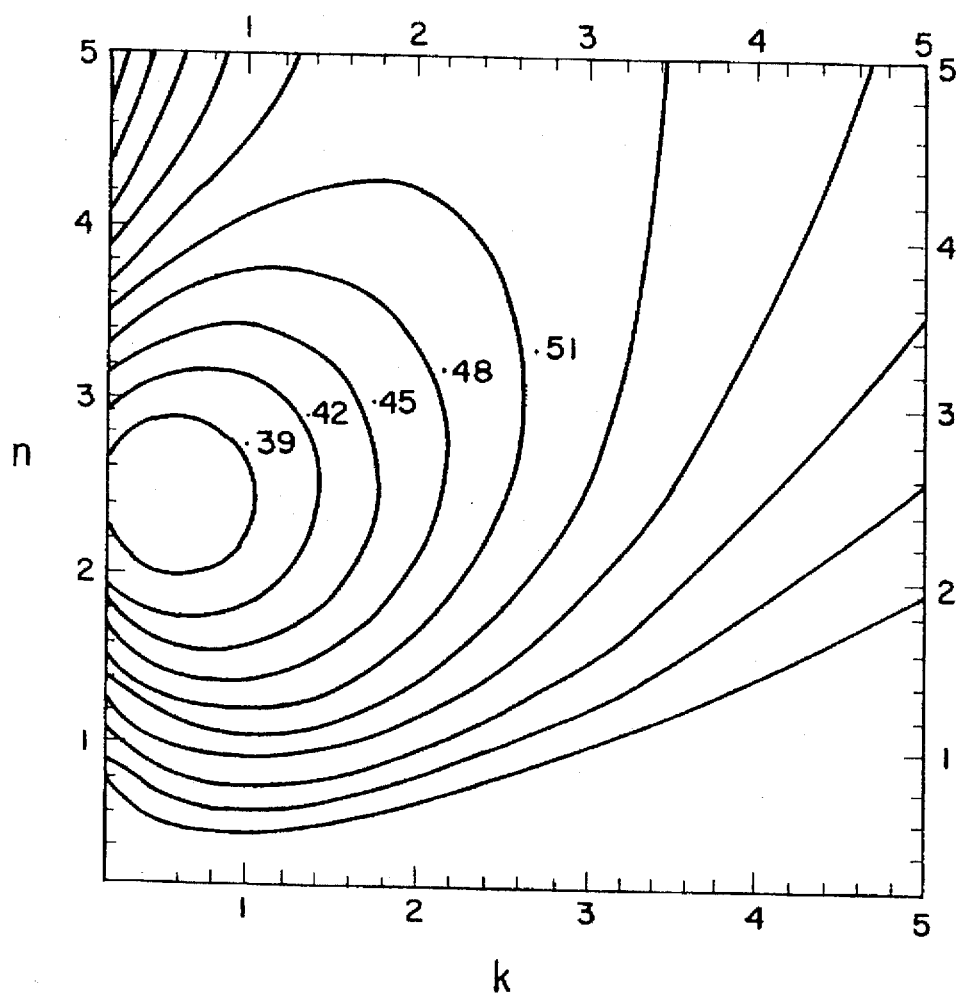
FIG. 8 is a view of the contour lines of the amount of light absorbed in the case of fixing the thickness of the antireflection film and changing the optical constants n and k.
Figure 9:
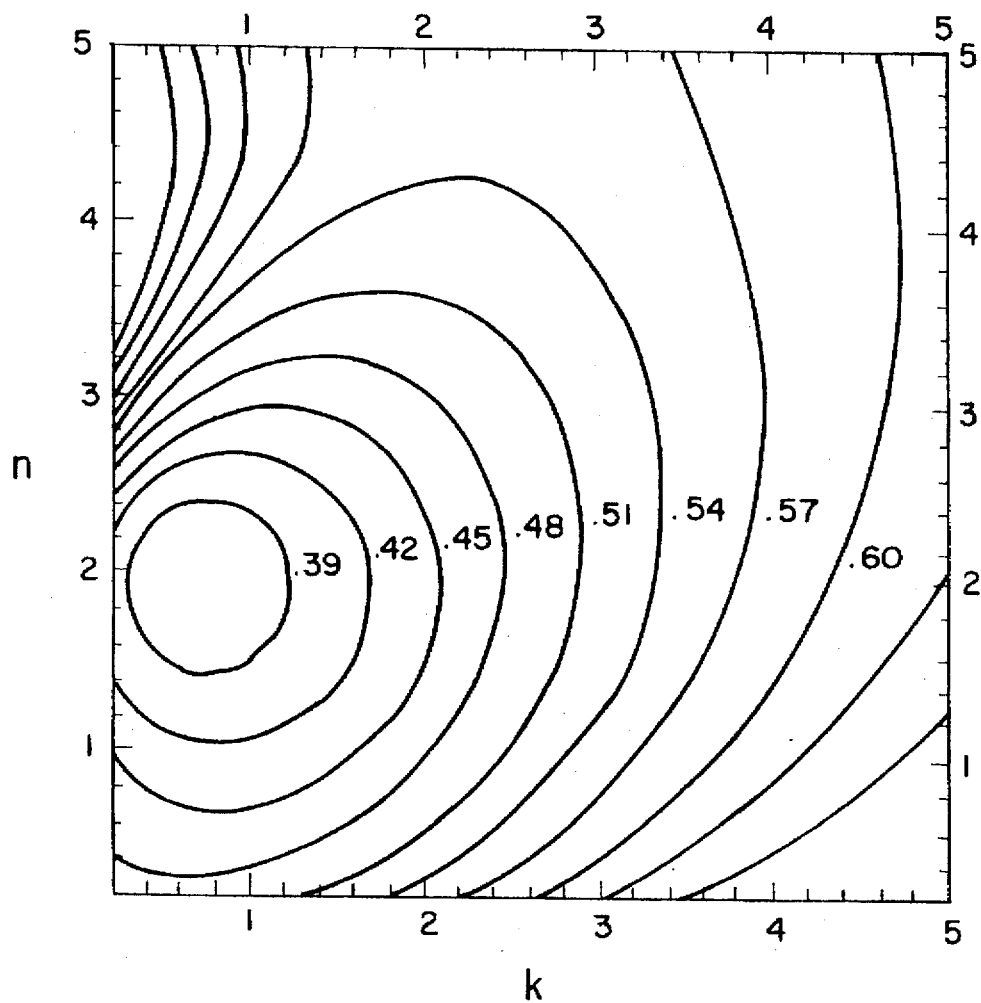
FIG. 9 is a view of the contour lines of the amount of light absorbed similar to FIG. 8 for another different resist thickness.
Figure 10:
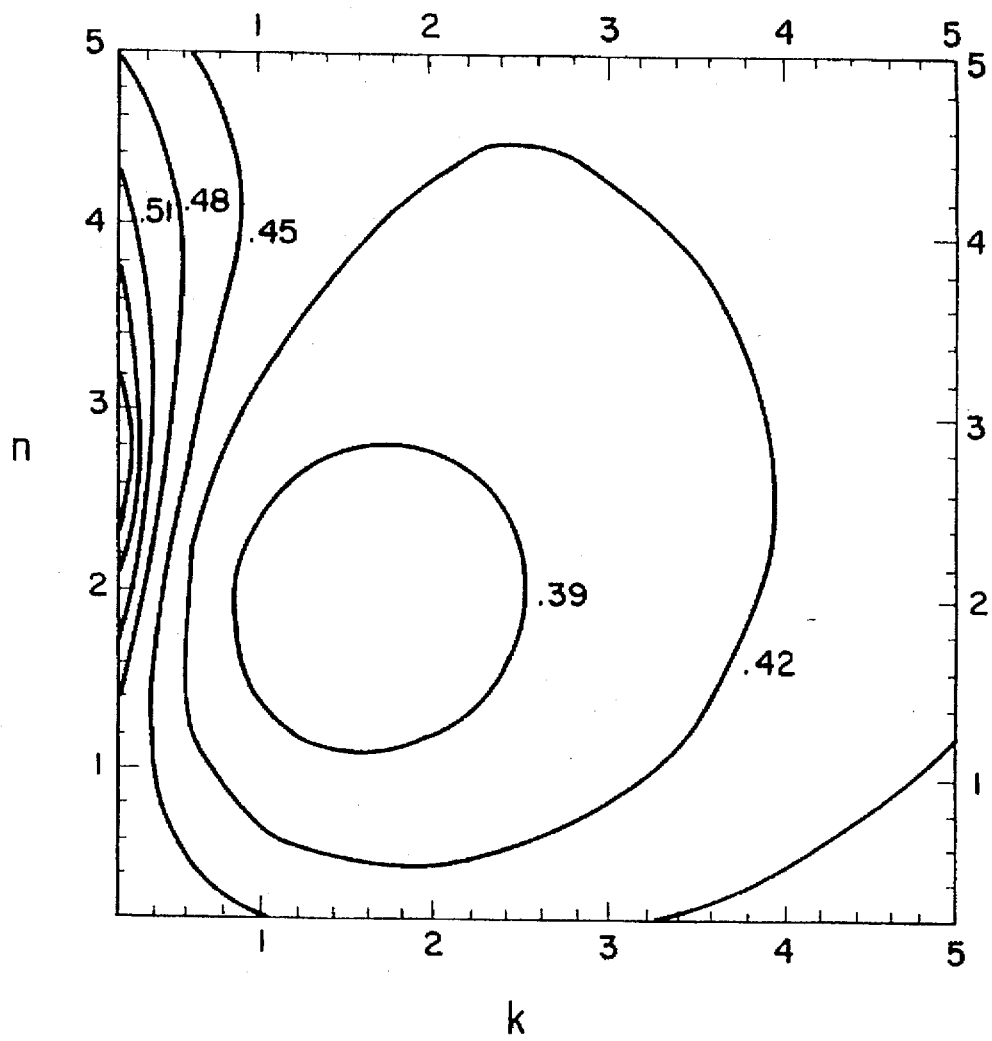
FIG. 10 is a view of the contour lines of the amount of light absorbed similar to FIG. 8 for another different resist thickness.
Figure 11:
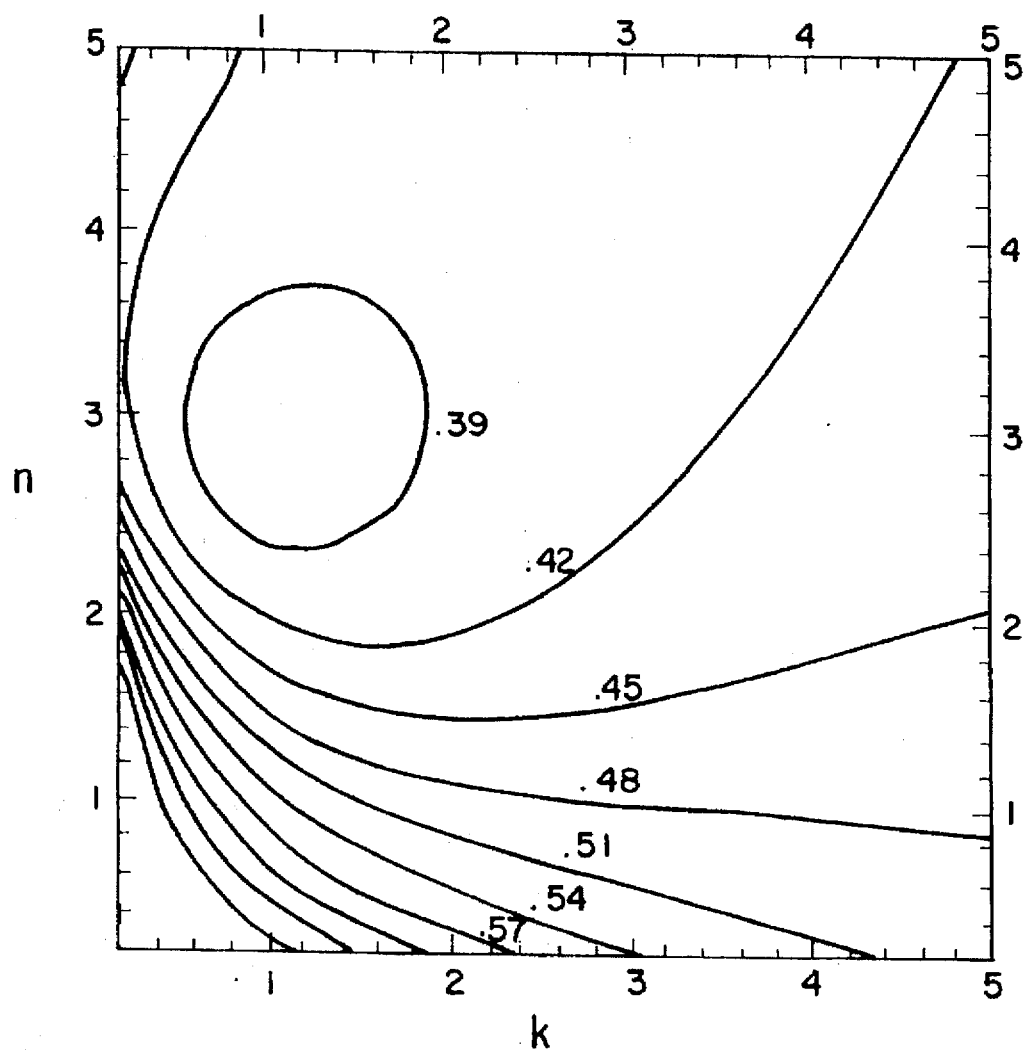
FIG. 11 is a view of the contour lines of the amount of light absorbed similar to FIG. 8 for another different resist thickness.

[4] When [3] is repeated for four locations at intervals of $\gamma/8n_{PR}$ based on the thickness where the standing wave effect becomes maximal or minimal for other different resist film thicknesses $d_{PR}$, FIG. 9 to FIG. 11 corresponding to FIG. 8 are obtained (FIG. 8 to FIG. 11 show the results when the thickness of the antireflection film is defined as 20 nm and the thickness of the resist film is made 985 nm, 1000 nm, 1018 nm, and 1035 nm, respectively). The above corresponds to the above means (I).

[5] The common areas of the graphs of FIG. 8 to FIG. 11 show the areas where the amounts of light absorbed in the resist films do not change despite changes in the thickness of the resist film for specific thicknesses of the antireflection film. That is, the common areas are areas where the antireflection effect is the greatest, that is, the standing wave effect is minimal. Accordingly, the common areas are found. To common areas may be found for example by simply superposing the graphs to obtain the common areas (of course, the common areas may also be found by computer). This corresponds to the above means (II).

[6] Next, the above [3], [4], and [5] are repeated while continuously changing the thickness d of the antireflection film. For example, if it is assumed that the procedure was performed using a d of 20 nm up to the initial step [5], the above is repeated while changing d. By this, it is possible to specify the conditions of the thickness $d_{art}$ and the optical constants $n_{art}$ and $k_{art}$ of the antireflection film giving the minimal standing wave effect. This corresponds to the above means [III].

[7] The type of film satisfying the conditions (thickness and optical constants) to be satisfied by the antireflection film specified in the above [6] is found by measuring the optical constants of the various films at the exposure light. This corresponds to the means [IV].

The above technique may in principle be applied to all wavelengths and all underlying substrates.

When antireflection films serving both as inorganic films able to be suitably used in the process according to the present invention in the means (I) to (IV) were studied, it was found that an $Si_xO_yN_2$ film or $Si_xN_y$ film was particularly suitable.

That is, when a monocrystalline silicon, polycrystalline silicon, amorphous silicon, doped polycrystalline silicon, or other silicon film, tungsten, tungsten silicide, titanium silicide, cobalt silicide, titanium nitride, titanium oxynitride, cobalt titanium silicide, molybdenum silicide, titanium, or other high melting point metal silicide film, aluminum, aluminum-silicon, aluminum-silicon copper, aluminum-copper, gold, silver, white silver, platinum, or other metal interconnection film is formed on the surface of the underlying substrate, it was found to be preferable to use, as the antireflection film serving also as the inorganic film formed on top of the same, an inorganic film having optical constants of $n=1.7$ to 2.4 and $k \leq 0.85$ (preferably $0.1 \leq k \leq 0.6$), particularly an $Si_xO_yN_2$ film (possibly containing hydrogen H) or an $Si_xN_y$ film at a thickness of 100 to 500nm.

The k was made in the above range because if k is over 0.85, while the thickness of the antireflection film can be reduced, there is a tendency for the function as an inorganic film to degrade, while if k is too small, there is a tendency for the thickness to become too great in order to maintain the function as an antireflection film. This is derived from the following relationship. That is, if the wavelength is made $\gamma$ and the absorption coefficient of the film is made $\alpha$ ($=4\pi k/\gamma$) and the imaginary part of the refractive index of the film is made k, the transmittance T of the film is given by the following expression, where the amount of incident light is $I_o$ and the transmitted light is I:

$$T (=I/I_o)=\exp(-\alpha d)$$

Further, the absorption index A of the film is given by $$A=I_o-I=I_o-I_oT=I_o\times(1-T)$$

That is, the smaller the transmittance T, the larger the absorption index A of the film. Further, the larger the absorption coefficient $\alpha$ ($=4\pi k/\gamma$) and the greater the thickness d, the smaller the transmittance T.

These $Si_xO_yN_2$ film or $Si_xN_y$ film can be easily formed by various CVD methods. For example, these films can be formed using the parallel plate type plasma CVD method, the ECR plasma CVD method, or the bias ECR plasma CVD method, using microwaves, and using a gaseous mixture of a silane gas and a gas including oxygen and nitrogen (for example, $SiH_4+O_2+N_2$) or a gaseous mixture of a silane gas and a gas including nitrogen (for example, $SiH_4+N_2O$), Further, at that time, it is possible to use argon Ar gas etc. as a buffer gas.

Figures 12A, 12B:
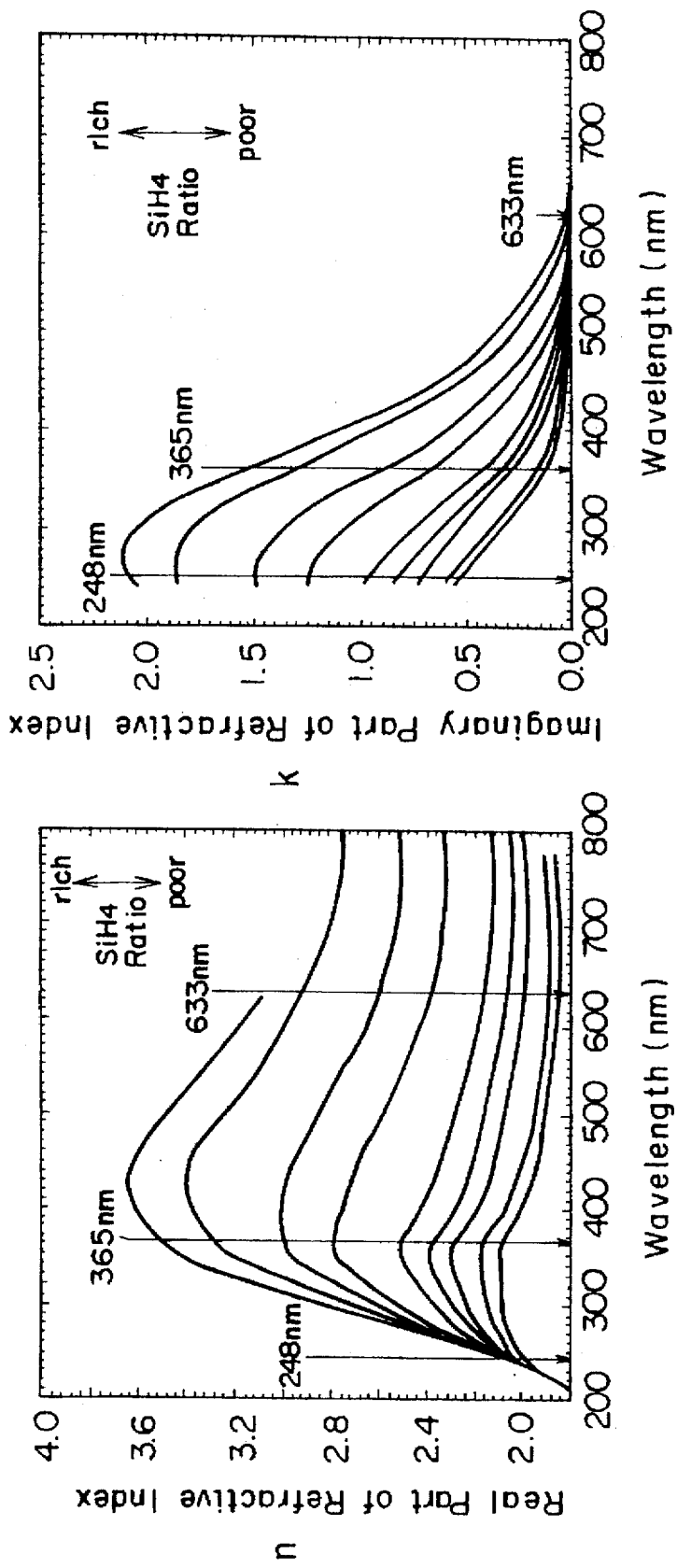
FIGS. 12A and 12B are graphs of the changes in the optical constants of $Si_xO_yN_2$ in the case of changing the manufacturing conditions.

For example, with an $Si_xO_yN_2$ film (in some cases containing hydrogen H and also called an $Si_xO_yN_2$:H film), as shown in FIGS. 12A and 12B, in accordance with the conditions at the time of film formation, in particular in accordance with the ratio of flow of the silane gas, for example, at a wavelength band of a wavelength of 248, the real part n of the refractive index is made a constant value of about 2.1, while the imaginary part k of the refractive index can be controlled as desired by changing the ratio of flow of the silane gas. Therefore, it is possible to easily prepare an antireflection film having values of optical constants required for an antireflection film for a specific underlying substrate.

For example, when using a W-Si substrate as the underlying substrate, an antireflection film of n=2.12, k=0.54, and d=29 nm is optimal, whereby the standing wave effect can be minimized. Further, when using an Al-Si substrate as the underlying substrate, an antireflection film of n=2.09, k=0.87, and d=24 nm is optimal, whereby the standing wave effect can be minimized. When using an Si substrate as the underlying substrate, an antireflection film of n=2.0, k=0.55, and d=32 nm is optimal, whereby the standing wave effect can be minimized.

Figure 13:
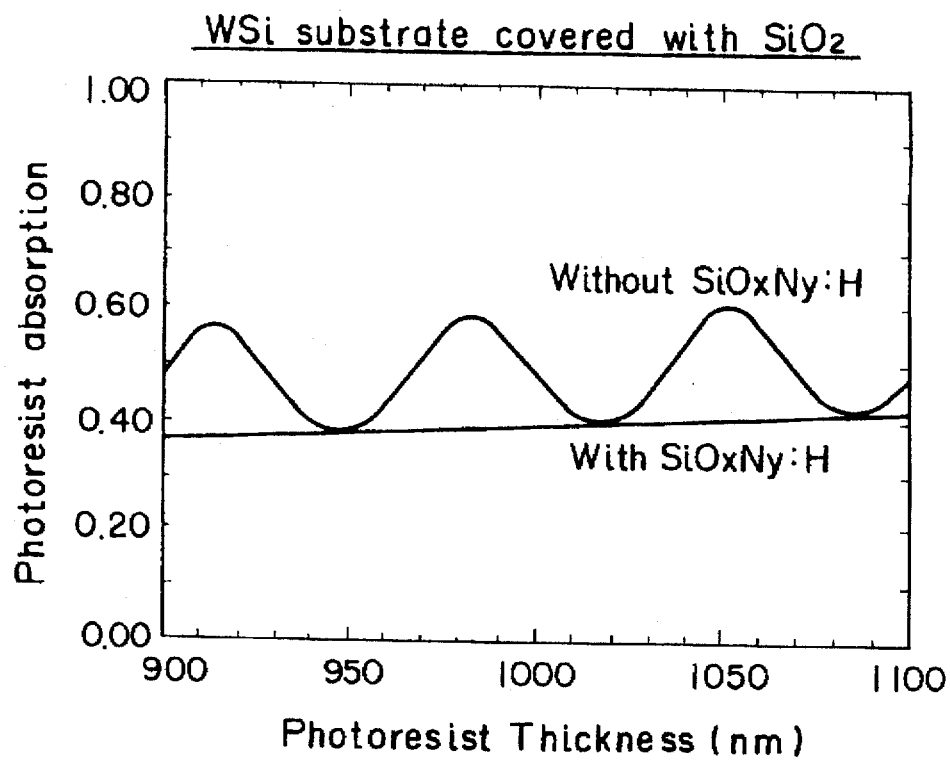
FIG. 13 is a graph of the antireflection effect in the case of forming an $Si_xO_yN_2$:H film on a tungsten silicide underlying substrate.
Figure 14:
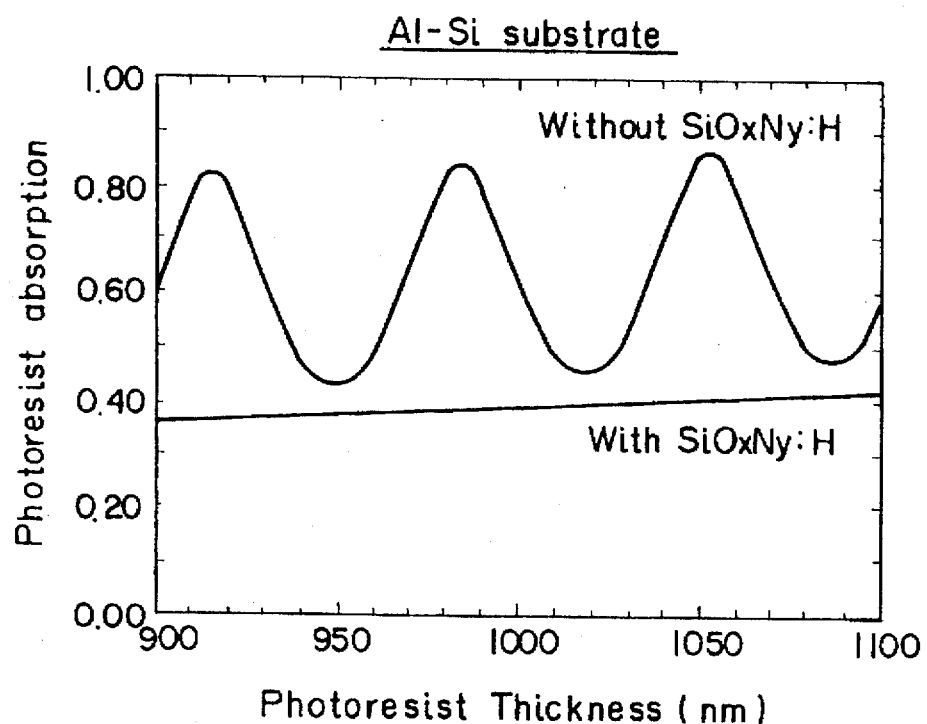
FIG. 14 is a graph of the antireflection effect in the case of forming an $Si_xO_yN_2$:H film on an aluminum silicide underlying substrate.
Figure 15:
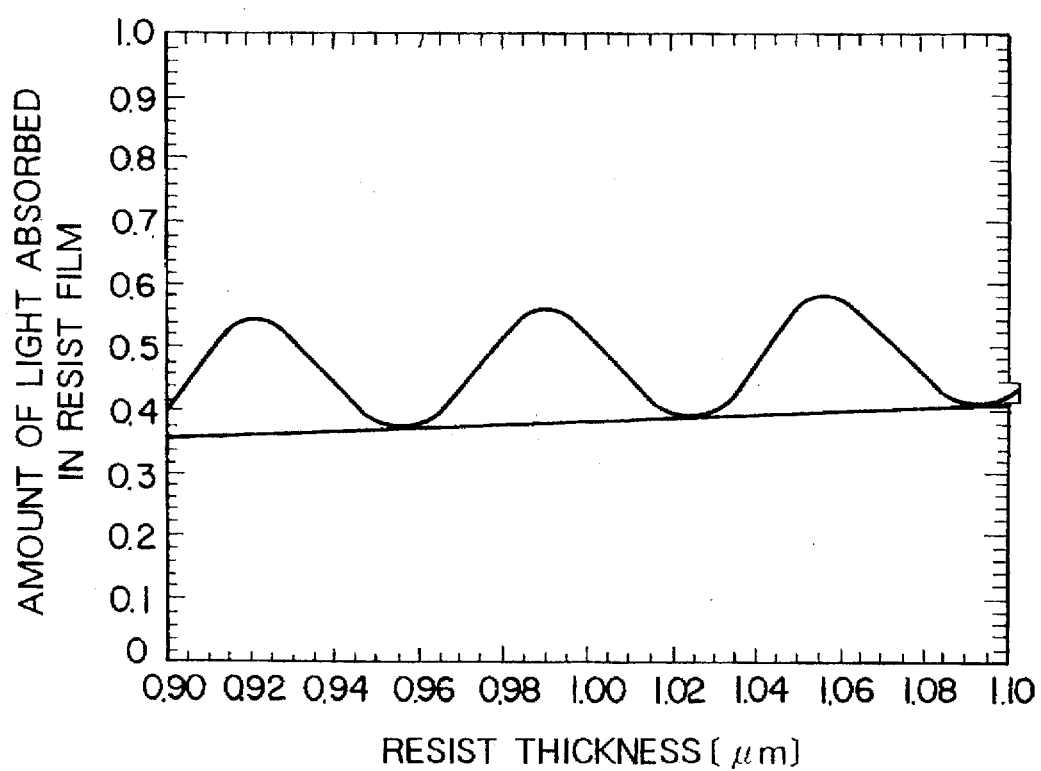
FIG. 15 is a graph of the antireflection effect in the case of forming an $Si_xO_yN_2$:H film on a silicon substrate.

The results of a comparison of the standing wave effects in the cases of formation of the $Si_xO_yN_2$ of these conditions as an inorganic film/antireflection film on tungsten silicide, aluminum silicide, and monocrystalline silicon with the cases of no use of these are shown in FIG. 13, FIG. 14, and FIG. 15. As shown in FIGS. 13 to 15, by using the $Si_xO_yN_2$:H film as an inorganic film/antireflection film, it is possible to suppress the standing wave effect and possible to achieve the antireflection effect.

Further, the $Si_xO_yN_z$ film or $Si_xN_y$ film can be easily etched by RIE (reactive ion etching), with Ar added to enhance the ionicity, using a resist as a mask and using $CF_4$, $CHF_3$, $C_2F_6$, $C_4F_8$, $SF_6$, $S_2F_2$, or $NF_3$ gas as an etchant. This RIE is preferably conducted under a pressure of about 2Pa and a power of 10 to 100 W. Further, the flow of the gas at the time of RIE is not particularly limited, but preferably is 5 to 70 SCCM.

In this way, since it is possible to easily etch the $Si_xO_yN_2$:H film by the same type of fluorine type gas, it is possible to simultaneously provide an antireflection film and an inorganic mask by forming an $Si_xO_yN_2$:H film at a film thickness (100 to 500 nm) on a metal layer. Further, an $Si_xO_yN_2$:H fill, compared with a silicon oxide film, requires about one-third of the etchant at the time of etching the underlying substrate and can be made about one-third the thickness compared with the case of achieving the same function as with an inorganic film by a silicon oxide film.

In the present invention, during the formation of a semiconductor mask pattern on a metal interconnection layer having step differences in its structure using i-rays or light of a wavelength shorter than that, for example, using i-rays or an KrF or ArF excimer laser, it is possible to form an excellent, stable mask pattern without increasing the number of steps by forming on the underlying substrate an inorganic film/antireflection fill providing both an antireflection effect and inorganic mask function.

Below, detailed examples of the present invention will be provided. The present invention, however, is not limited to these examples and can be modified in various ways within the scope of the invention.

EXAMPLE 1

This example is an example of formation of a semiconductor mask pattern on a metal interconnection layer (electroconductive layer) having step differences in structure using i-rays (365 nm) or light of a wavelength shorter than this, for example, using i-rays or a KrF or ArF excimer laser, wherein use is made, on the metal layer, of the $Si_xO_yN_z$:H film discovered by the present inventors as an inorganic film for providing both an antireflection effect and inorganic mask function to enable formation of an excellent, stable mask pattern without increasing the number of steps in the process.

The process of production of the present example can be suitably applied to the process of production of a semiconductor device wherein a semiconductor mask pattern is formed on a metal interconnection layer of for example, Al, Al-Si, Al-Si-Cu, Al-Cu, Au, Ag, and Pt as shown in FIGS. 16A to 16D and FIGS. 17E and 17F. However, the thinking in this example naturally can be applied regardless of the type of the substrate, the type of the resist, or the type of the antireflection layer.

The example shown in FIGS. 16A to 16D and FIGS. 17E to 17F will be explained now in further detail.

Figure 16A:
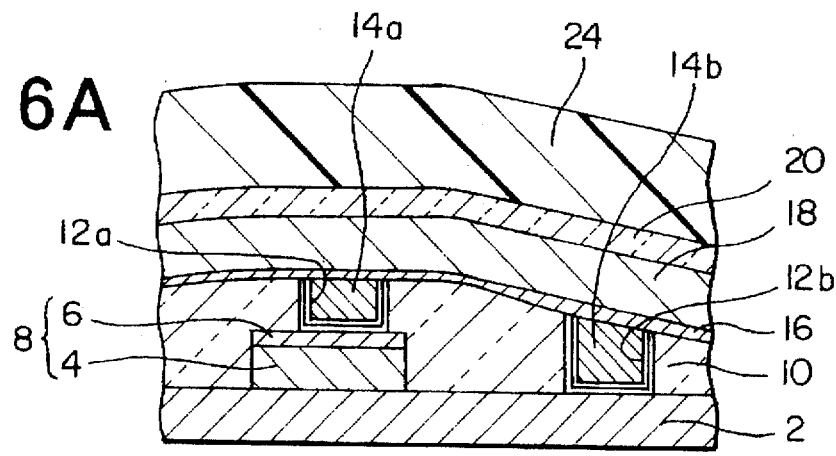
FIGS. 16A to 16D are cross-sectional views of key portions showing the process of production of a semiconductor device using the process of the present invention.

In this example, as shown first in FIG. 16A, a gate electrode 8 of a polysilicide structure comprised of a polycrystalline silicon layer 4 and tungsten silicide 6 is formed on the surface of a semiconductor substrate 2 through a gate insulating layer. An interlayer insulating film 10 such as a silicon oxide film is formed on top of this. The thickness of the interlayer insulating film 10 is not particularly limited, but for example is 300 to 600 nm, preferably about 500 nm.

Next, a micropattern of contact holes 12a and 12b is formed on the interlayer insulating film 10. This micropattern of contact holes 12a and 12b is formed by the method developed by the present inventors, but is not directly related to the present invention, so a detailed explanation will be omitted and the method will be just briefly explained.

That is, in the interlayer insulating film 10, when using a photomask for exposure, there is a difference in the optical conditions of the underlying substrate (semiconductor substrate 2 on which the polycrystalline silicon film 4, the tungsten silicide film 6, and the interlayer insulating film 10 are formed) between the area positioned above the tungsten silicide 6 and the area positioned above the impurity diffusion layer formed on the surface of the semiconductor substrate 2. It was difficult in the past to form a micropattern by a single exposure at areas with differing optical conditions.

Therefore, first, a high absorption film is formed over the entire surface of the interlayer insulating film 10. As the high absorption film, use may be made of an n=0.5 to 7 and k=1.5 to 3.5 monocrystalline silicon, polycrystalline silicon, amorphous silicon, doped silicon, or other silicon material with a thickness of 9.5 to 40 nm. Further, use may be made of tungsten, cobalt, titanium, or another high melting point metal or high melting point metal compound, in particular, tungsten nitride, titanium oxynitride, and other titanium materials. These high melting point metals or high melting point metal compounds have optical constants of n=0.5 to 3.0 and k=0.5 to 3.0 with respect to the exposure light. Further, high absorption films comprised of these high melting point metals or high melting point metal compounds preferably are used in thicknesses of 15 to 120 nm. It is also possible to use a tungsten silicide or other high melting point metal silicide material. These high melting point metal silicide materials have optical constants of n=0.5 to 4.5 and k=1.5 to 3.5 with respect to the exposure light. Further, the high absorption films comprised of these high melting point metal silicides are preferably used in thicknesses of 8 to 30 nm.

By forming such a high absorption film, it becomes possible to treat the underlying substrate in the same way as an optically uniform substrate. Next, a resist film is formed on the surface of the high absorption film through the antireflection film. Then, a photomask is used to pattern the resist film, whereby it is possible to minimize the standing wave effect and process the resist film to a micropattern with a high precision. Then, the interlayer insulating film 10 is etched by the resist film to form the micropattern of contact holes 12a and 12b.

Next, in this example, use is made of the selective growth method etc. to form tungsten or other burying plug layers 14a and 14b in the contact holes 12a and 12b. Next, an underlying layer 16 of titanium nitride (TiN) for example is formed on the interlayer insulating layer 10 in which the tungsten or other burying plug layers 14a and 14b are formed. The underlying layer 16 is for example formed by sputtering or the CVD method. Its thickness is not particularly limited, but is 50 to 150 nm, preferably about 100 nm.

Next, a metal interconnection layer 18 made of Al, Al-Si, Al-Si-Cu, Al-Cu, or the like is formed as an electroconductive layer on the underlying layer 16. The metal interconnection layer 18 is formed for example by sputtering or the CVD method. Its thickness is not particularly limited, but is 300 to 500 nm, preferably about 400 nm.

The method of the present example is one which processes this metal interconnection layer 18 into a predetermined micropattern. The following method is adopted.

That is, as shown in FIG. 16A, an $Si_xO_yN_z$ film (containing hydrogen H, hereinafter sometimes also referred to as a "$Si_xO_yN_z$:H film") is formed as an antireflection film 20 serving also as an inorganic film according to the present example on the metal interconnection layer 18. This antireflection film 20 is not particularly limited, but has a refractive index (n) of from 1.7 to 2.4 and an imaginary part (k) of the refractive index of not more than 0.85. The thickness of this antireflection film is not particularly limited, but preferably is 100 to 500 nm, more preferably about 200 nm.

The $Si_xO_yN_z$:H film may be formed using the parallel plate plasma CVD method, the ECR plasma CVD method, or the bias ECR plasma CVD method, using microwaves, and using a gaseous mixture of a silane gas and a gas containing oxygen and nitrogen (for example $SiH_4+O_2+N_2$) or a gaseous mixture of a silane gas and a gas containing nitrogen (for example, $SiH_4+N_2O$).

In this $Si_xO_yN_z$:H film, by controlling the ratio of flow of gases when forming the film, for example, as shown by FIG. 12A and 12B, by making the real part n of the refractive index a constant value of about 2.1 at a wavelength of 248 nm and by changing the ratio of flow of the gas containing the silicon, it is possible to freely control the imaginary part k of the refractive index.

The optimal conditions of the refractive index for different thicknesses of the antireflection film 20, as explained above in the discussion of the problems in the related art, may be freely determined so as to minimize the standing wave effect in accordance with the optical conditions of the underlying substrate. By changing the ratio of flow of the gas containing the silicon, it is possible to control the imaginary part k of the refractive index with respect to the conditions of the underlying substrate and thereby combine the $Si_xO_yN_z$:H film with various types of underlying substrates.

Figure 18:
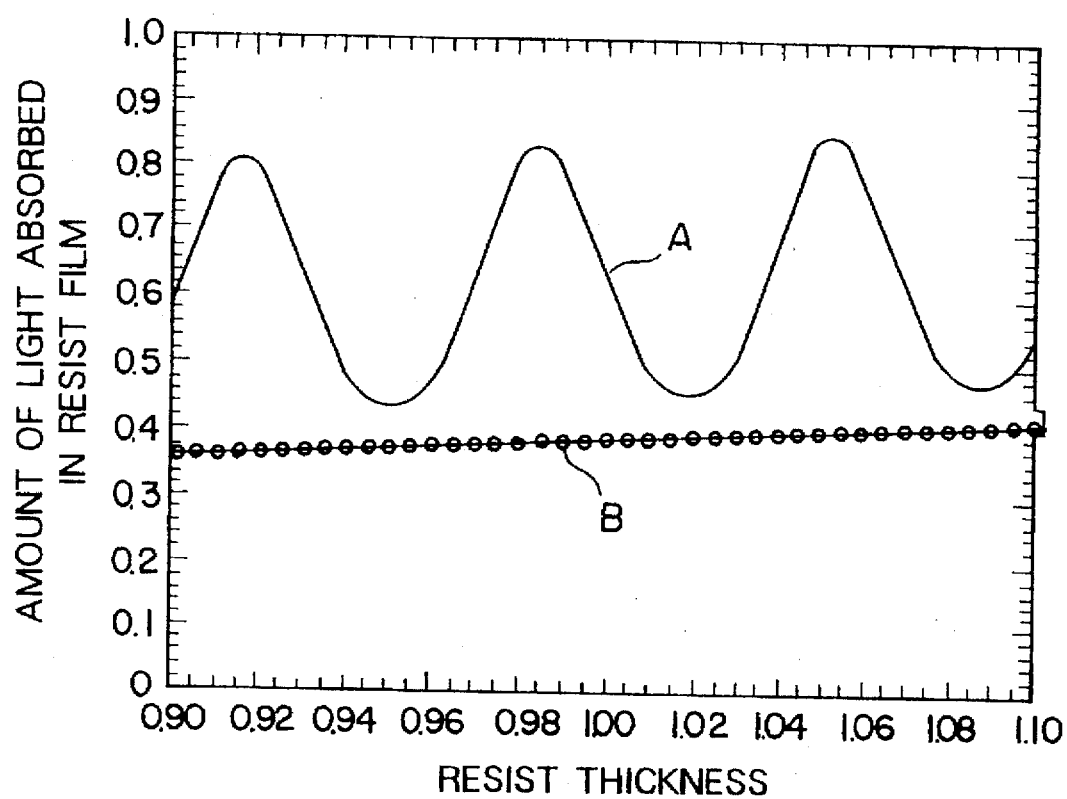
FIG. 18 is a graph of the antireflection effect in the case of forming an $Si_xO_yN_2$:H film on an aluminum silicon silicide underlying substrate.

For example, when processing an Al-Si metal interconnection layer 18, use is made, as the inorganic film/antireflection film 20 formed on it, of an $Si_xO_yN_z$:H film of a thickness d of 25 nm having optical constants of n=2.08 and k=0.85. The antireflection effect (standing wave effect) in the case of use of an $Si_xO_yN_z$:H film as the inorganic film/antireflection film on the Al-Si is shown in FIG. 18. As shown in FIG. 18, compared with the standing wave effect in the case of forming a resist film (XP8843) directly on the Al-Si without providing the inorganic film/antireflection film 20 (curve A), the standing wave effect in the case of forming the resist film (XP8843) through an $Si_xO_yN_z$:H film of a thickness d of 25 nm having optical constants of n=2.08 and k=0.85 (curve B) is prevented to a great extent and the variation can be held to less than ±0.48 percent. That is, an effective antireflection effect was confirmed for an $Si_xO_yN_z$:H film of a thickness d of 25 nm having optical constants of n=2.08 and k=0.85.

Note that the $Si_xO_yN_z$:H film used in the experiment shown in FIG. 18 was formed by the CVD method using $SiH_4$ gas and $N_2O$ gas. The ratio of flow was an $SiH_4/N_2O$ of 0.83. Further, as the exposure light, use was made of KrF. The $n_{PR}$ and $k_{PR}$ of the resist were 1.801 and 0.011, respectively. Further, the $n_{sub}$ and $k_{sub}$ of the Al-Si substrate were 0.089 and 2.354, respectively.

A similar effect of the antireflection film can be obtained by reducing the imaginary part k of the refractive index dominating the amount of absorption of the film and increasing the thickness by that amount.

Figure 19:
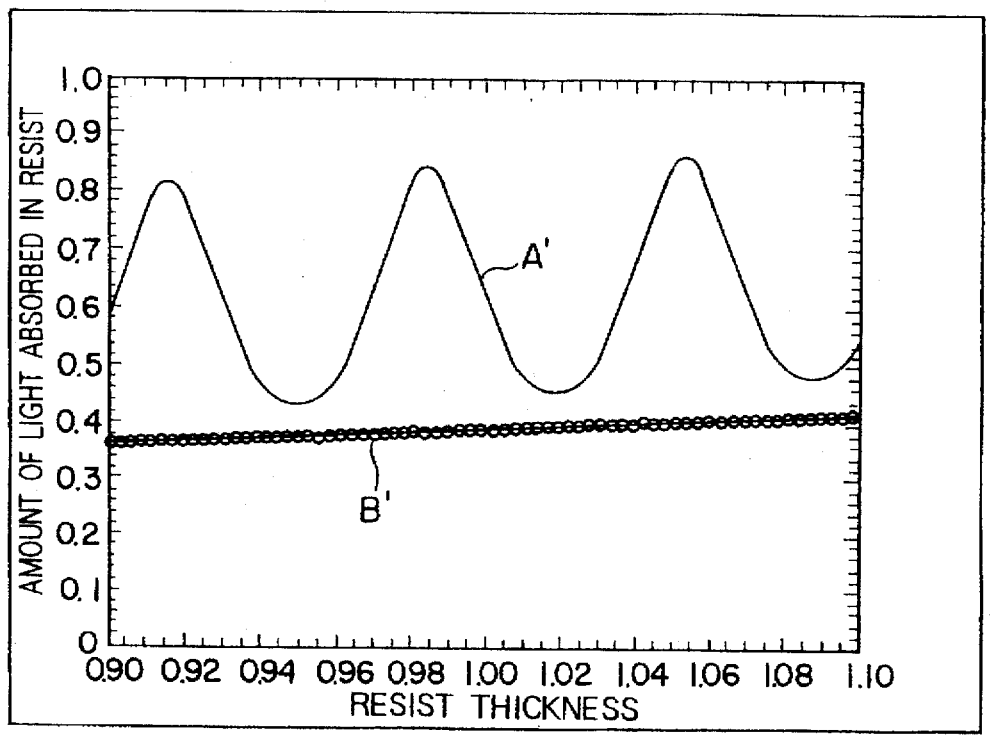
FIG. 19 is a view of the antireflection effect caused by formation of an $Si_xO_yN_2$:H film on an aluminum silicon silicide underlying substrate in which the optical conditions and the thickness of the $Si_xO_yN_2$:H film are changed from those of FIG. 18.

FIG. 19 shows by the curve B' the standing wave effect in the case of forming on an Al-Si substrate an $Si_xO_yN_z$:H film of n=2.04 and k=0.225 to a thickness d of 205 nm as the inorganic film/antireflection film thickness and then coating a resist (XP8843) on the film. Note that the curve A' shows the standing wave effect in the case of forming a resist fill directly without providing an inorganic film/antireflection film. As shown in the figure, by using the inorganic film/antireflection film, substantially the entire standing wave effect is eliminated.

The $Si_xO_yN_z$:H film used in the experiment shown in FIG. 19 was formed by the CVD method using $SiH_4$ gas and $N_2O$ gas at a ratio of flow of $SiH_4/N_2O$ of 0.75. As the exposure light, use was made of KrF (wavelength γ=248 nm). The $n_{PR}$ and $k_{PR}$ of the resist were 1.801 and 0.011, respectively. Further, the $n_{sub}$ and $k_{sub}$ of the Al-Si substrate were 0.089 and 2.354, respectively.

Under conditions giving the curves B and B' shown in FIG. 18 and FIG. 19, the inorganic film/antireflection film 20 is formed on the metal interconnection layer 18 as shown in FIG. 16A and then the resist film 24 is formed on top of that. The resist film 24 is not particularly limited, but for example use is made of XP8843 with an $n_{PR}$ and $k_{PR}$ of 1.802 and 0.0107 or another resist film. The resist film 24 is formed for example by the spin coating method. The thickness of the resist film 24 is not particularly limited, but preferably is 600 to 1200 nm, more preferably 1000 nm or so. Even if some step difference is formed at the underlying layer portion where the resist film 24 is formed, as mentioned above, since the inorganic film/antireflection film 20 minimizes the standing wave effect, the error in the pattern dimensions to be formed can be held to a minimum.

Figure 16B:
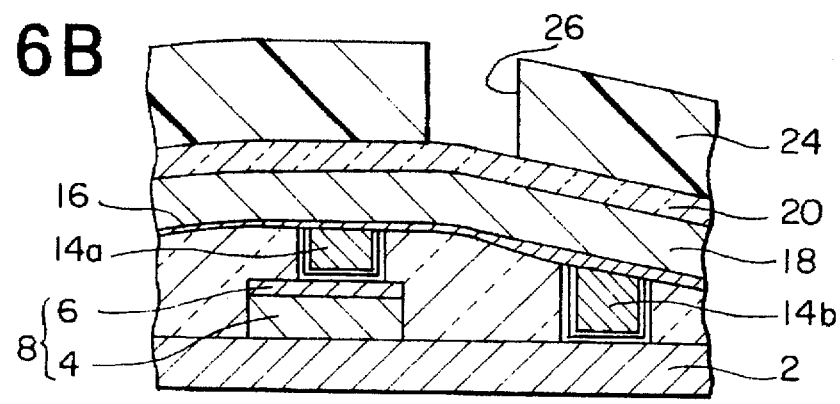

Next, in this example, to form a micropattern on the resist film 24, use is made of an exposure apparatus using i-rays or light of a wavelength shorter than that to perform the exposure process and, as shown in FIG. 16B, to form the micropattern 26 on the resist film 24. At that time, in this example, since an inorganic film/antireflection film 20 is formed on the metal interconnection layer 18 to be processed and a resist film 24 is formed over that, it is possible to perform microprocessing of the resist film 24 in a state with the standing wave effect held to a minimum. Accordingly, it is possible to excellently and stably form a high precision micropattern 26 on the resist film 24.

Figure 16C:
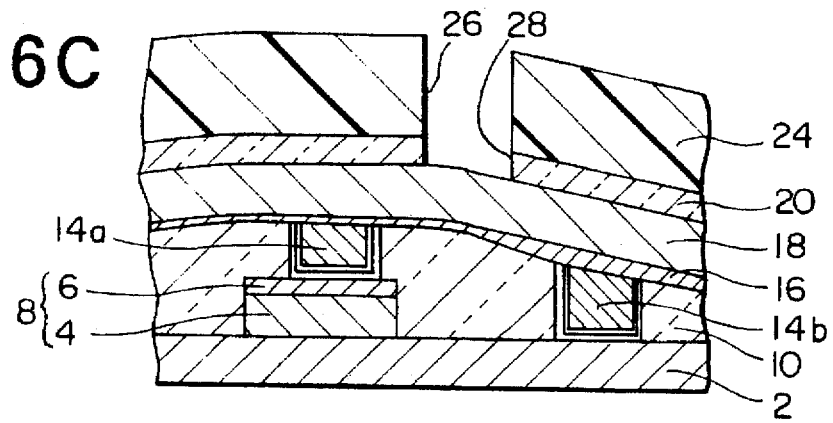

Next, the resist film 24 processed with the micropattern 26 is used as a mask and the inorganic film/antireflection film comprised of the $Si_xO_yN_z$:H film is etched to the predetermined micropattern 28 as shown in FIG. 16C. During the etching, $CHF_3$ (50 to 100 SCCM)+$O_2$ (30 SCCM) or other fluorine type gas is used and power of about 100 to 1000 W is applied under a pressure of 2 Pa or so as to perform RIE with an enhanced ionicity.

Figure 16D:
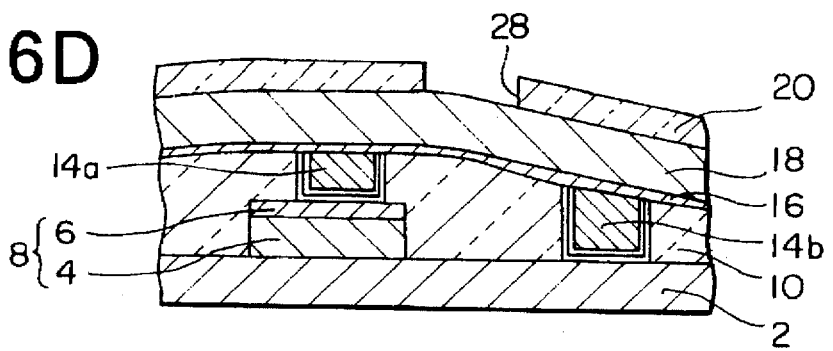

Next, as shown in FIG. 16D, the resist film 24 is removed by oxygen plasma etc. Note that in the present invention, the etching process of the next step may be performed without having to remove the resist film 24, but removing the resist film 24 tends to give a better patterning by the etching of the next step. The reason is that if the underlying substrate is processed with the resist film attached, there is a danger of a detrimental effect being given to the processing of the underlying substrate by the carbon C contained in the resist film.

Figure 17E:
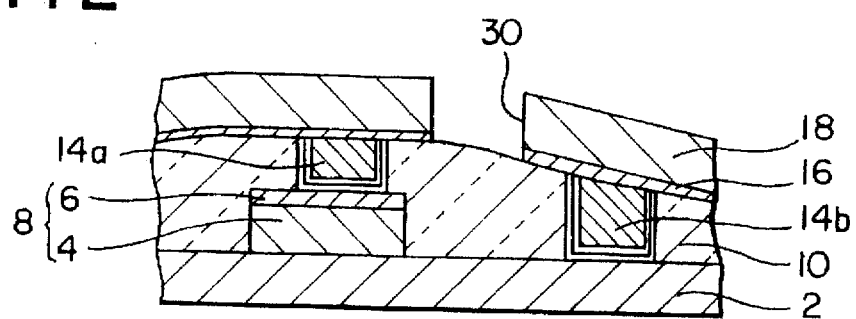
FIGS. 17E and 17F are cross-sectional views of key portions showing the process of production after FIG. 16D.

Next, in the present example, the inorganic film/antireflection film 20 formed in the micropattern 28 is used as a mask and a gas containing at least chlorine is used, as shown in FIG. 17E, to simultaneously etch the antireflection film 20 and the metal interconnection layer 18 and underlying layer 16, thereby transferring the semiconductor mask pattern to the metal interconnection layer 18 and its underlying layer 16 and form the micropattern 30. The etching rate of the $Si_xO_yN_z$:H film (antireflection film 20) with respect to the chlorine gas is about 300 nm, while the etching rate of the metal interconnection film is about 700 nm. The thickness of the metal interconnection layer 18 is about 400 nm, so by using an $Si_xO_yN_z$:H film of a thickness of at least about 170 nm as the inorganic film/antireflection film 20, it is possible to have the semiconductor mask pattern transferred to the metal interconnection layer 18 by the inorganic mask comprised of the $Si_xO_yN_z$:H film and therefore form stably and excellently a micropattern 30. The antireflection film 20 serving as the inorganic film is removed at the same time as the formation of the micropattern 30.

That is, by using an $Si_xO_yN_z$:H film of a thickness of at least half of the thickness of the metal interconnection film 18 being processed, it is possible to transfer the semiconductor mask pattern in an excellent manner.

In the process of production of the present example, it is possible to reduce the thickness of the $Si_xO_yN_z$:H film serving as the inorganic mask/antireflection film 20 at the same time as etching the metal interconnection layer 18 (or possible to completely remove the $Si_xO_yN_z$:H film). The step differences on the metal interconnection layer 18 are never made greater.

Further, in the process of production of the present example, it is possible to use the antireflection film 20, which is absolutely required, as an inorganic mask, so the process of production of this example does not increase the number of steps over the conventional process for production.

Figure 17F:
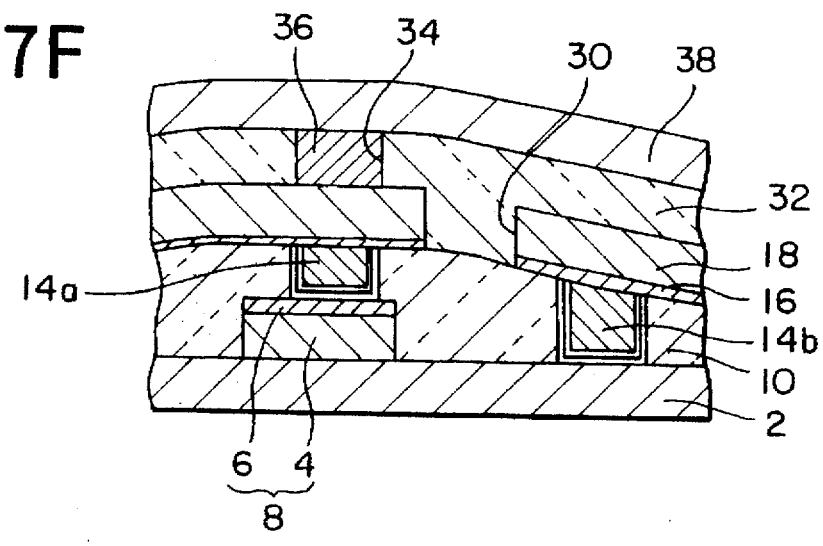

After forming the micropattern on the metal interconnection layer 18, for example, as shown in FIG. 17F, an interlayer insulating layer 32 comprised of silicon oxide etc. is formed, then a micropattern of contact holes 34 is formed in the interlayer insulating layer 32. The micropattern of contact holes can be formed by the above-mentioned method using a high absorption layer and an antireflection film.

Next, buried plug layers 36 are formed by the selective growth of tungsten etc. in the contact holes 34 and an upper metal interconnection layer 38 is formed over the same. When processing the upper metal interconnection layer 38 to a micropattern, it is also possible to use the example of the present invention.

EXAMPLE 2

In this example, the same procedure was followed as the Example 1 to form a micropattern on a semiconductor device except that the $Si_xO_yN_z$:H film used as the inorganic film/antireflection film was formed by the following technique.

That is, in this example, the $Si_xO_yN_z$:H film was formed using the parallel plate type plasma CVD method, the ECR plasma CVD method, or the bias ECR plasma CVD method, using microwaves (2.45 GHz), and using a gaseous mixture of $SiH_4+O_2+N_2$ or a gaseous mixture of $SiH_4+N_2O$.

EXAMPLE 3

In this example, the same procedure was followed as the Example 1 to form a micropattern on a semiconductor device except that the $Si_xO_yN_z$:H film used as the inorganic film/antireflection film was formed by the following technique.

That is, in this example, the $Si_xO_yN_z$:H film was formed using the parallel plate type plasma CVD method, the ECR plasma CVD method, or the bias ECR plasma CVD method, using microwaves (2.45 GHz), using a gaseous mixture of $SiH_4+O_2+N_2$ or a gaseous mixture of $SiH_4+N_2O$, and using Ar as a buffer gas.

EXAMPLE 4

In this example, the same procedure was followed as the Example 1 to form a micropattern on a semiconductor device except that the $Si_xO_yN_z$:H film used as the inorganic film/antireflection film was formed by the following technique.

That is, in this example, the inorganic film/antireflection film was formed using the parallel plate type plasma CVD method, the ECR plasma CVD method, or the bias ECR plasma CVD method and using a gaseous mixture of $SiH_4+O_2+N_2$ or a gaseous mixture of $SiH_4+N_2O$.

EXAMPLE 5

In this example, the same procedure was followed as the Example 1 to form a micropattern on a semiconductor device except that the $Si_xO_yN_z$:H film used as the inorganic film/antireflection film was formed by the following technique.

That is, in this example, the inorganic film/antireflection film was formed using the parallel plate type plasma CVD method, the ECR plasma CVD method, or the bias ECR plasma CVD method, using a gaseous mixture of $SiH_4+O_2+N_2$ or a gaseous mixture of $SiH_4+N_2O$, and using Ar or $N_2$ as a buffer gas. Further, oxygen plasma treatment was done on the $Si_x O_y N_z$:H film, after forming the film.

EXAMPLE 6

In this example, the same procedure was followed as the Example 1 to form a micropattern on a semiconductor device except that $Si_xN_y$ was used instead of the $Si_xO_yN_z$:H film used as the inorganic film/antireflection film show in Example 1 and was formed by the following technique.

That is, in this example, the inorganic film/antireflection film was formed using the parallel plate type plasma CVD method, the ECR plasma CVD method, or the bias ECR plasma CVD method, using microwaves (2.45 GHz), and using a gaseous mixture of $SiH_4+NH_3$ or a gaseous mixture of $SiH_2Cl_2+NH_3$.

EXAMPLE 7

In this example, the same procedure was followed as the Example 1 to form a micropattern on a semiconductor device except that $Si_xN_y$ was used instead of the $Si_xO_yN_z$:H film used as the inorganic film/antireflection film show in Example 1 and was formed by the following technique.

That is, in this example, the inorganic film/antireflection film was formed using the parallel plate type plasma CVD method, the ECR plasma CVD method, or the bias ECR plasma CVD method, using microwaves (2.45 GHz), using a gaseous mixture of $SiH_4+O_2$ or a gaseous mixture of $SiH_2Cl_2+NH_3$, and using Ar as a buffer gas.

EXAMPLE 8

In this example, the same procedure was followed as the Example 1 to form a micropattern on a semiconductor device except that $Si_xN_y$ was used instead of the $Si_xO_yN_z$:H film used as the inorganic film/antireflection film show in Example 1 and was formed by the following technique.

That is, in this example, the inorganic film/antireflection film was formed using the parallel plate type plasma CVD method, the ECR plasma CVD method, or the bias ECR plasma CVD method and using a gaseous mixture of $SiH_4+O_2$ or a gaseous mixture of $SiH_2Cl_2+NH_3$.

EXAMPLE 9

In this example, the same procedure was followed as the Example 1 to form a micropattern on a semiconductor device except that $Si_xN_y$ was used instead of the $Si_xO_yN_z$:H film used as the inorganic film/antireflection film show in Example 1 and was formed by the following technique.

That is, in this example, the inorganic film/antireflection film was formed using the parallel plate type plasma CVD method, the ECR plasma CVD method, or the bias ECR plasma CVD method, using a gaseous mixture of $SiH_4+O_2$ or a gaseous mixture of $SiH_2Cl_2+NH_3$, and using Ar or $N_2$ as a buffer gas. Further, oxygen plasma treatment was done on the $Si_x O_y N_z$:H film, after forming the film.

As explained above, according to the process of production of a micropattern according to the present invention, it is possible to form an excellent, stable mask pattern even if the mask pattern is a miniature one using the inorganic mask method without increasing the number of steps even when etching a metal layer, where there had been a problem with dimension conversion error during the etching. The process of production of a micropattern according to the present invention is suitable for use for a process of production of a semiconductor device on which a micropattern is formed.

I claim:

1. A process for production of a micropattern, comprising the steps of forming an antireflection film containing at least nitrogen and oxygen as constituent elements on an underlying substrate;

forming a resist film on said antireflection film;

exposing selected portions of said resist film using i-rays or light of a wavelength shorter than i-rays and developing the exposed film to form a mask pattern in the resist film;

using the resist film as an etching mask and etching the antireflection film to transfer the mask pattern to the antireflection film;

removing the resist film; and using the antireflection film as a mask and etching the underlying substrate to transfer the mask pattern of the antireflection film to the underlying substrate, said antireflection film having a refractive index (n) of at least 1.7 and not more than 2.4, an imaginary part (k) of the refractive index of not more than 0.85, and a thickness of from 100 to 500 nm.

2. A process according to claim 1, wherein the step of etching the underlying substrate simultaneously etches the antireflection film.

3. A process for production of a micropattern, comprising the steps of forming an antireflection film consisting of an inorganic film on an underlying substrate;

forming a resist film on said antireflection film;

exposing selected portions of said resist film using i-rays or light of a wavelength shorter than i-rays and then developing the exposed resist film to form a mask pattern with openings therein;

using the mask pattern in the resist film as an etching mask and etching the antireflection film to remove the film at the openings in the mask pattern;

removing the remaining portion of the resist film; and then using the antireflection film with portions removed therefrom as an etching mask and etching the underlying substrate to remove portions of the substrate at the openings of the mask pattern to the underlying substrate.

4. A process for production of a micropattern as set forth in claim 3, wherein as said antireflection film, use is made of a film containing at least nitrogen and silicon as constituent elements.

5. A process for production of a micropattern as set forth in claim 4, wherein as said antireflection film, use is made of a film further containing oxygen as a constituent element.

6. A process for production of a micropattern as set forth in claim 5, wherein as said antireflection film, use is made of a film further containing hydrogen as a constituent element.

7. A process for production of a micropattern as set forth in claim 3, wherein as said antireflection film, use is made of a film with a refractive index (n) of at least 1.7 and not more than 2.4, an imaginary part (k) of the refractive index of not more than 0.85, and a thickness of from 100 to 500 nm.

8. A process for production of a micropattern as set forth in claim 3, wherein as said antireflection film, use is made of a film with a refractive index (n) of at least 1.7 and not more than 2.4, an imaginary part (k) of the refractive index of at least 0.1 and not more than 0.6, and a thickness of from 100 to 500 nm.

9. A process according to claim 8, wherein the step of forming the antireflection film forms a film of a thickness greater than the thickness of the underlying substrate to be removed during the etching of the substrate, and said step of etching the substrate using the antireflection film as an etching mask simultaneously etches the antireflection film to remove the antireflection film when the desired thickness of the underlying substrate has been removed.

* * * * *